United States Patent
Brioschi et al.

(10) Patent No.: US 10,091,587 B2
(45) Date of Patent: Oct. 2, 2018

(54) MULTI-DEVICE TRANSDUCER MODULE, APPARATUS INCLUDING THE TRANSDUCER MODULE AND METHOD OF MANUFACTURING THE TRANSDUCER MODULE

(71) Applicant: STMICROELECTRONICS S.R.L., Agrate Brianza (IT)

(72) Inventors: Roberto Brioschi, Sesto San Giovanni (IT); Marco Omar Ghidoni, Melzo (IT)

(73) Assignee: STMICROELECTRONICS S.R.L., Agrate Brianza (IT)

(*) Notice: Subject to any disclaimer, the term of this patent is extended or adjusted under 35 U.S.C. 154(b) by 0 days.

(21) Appl. No.: 15/377,627

(22) Filed: Dec. 13, 2016

(65) Prior Publication Data
US 2017/0318396 A1 Nov. 2, 2017

(30) Foreign Application Priority Data

Apr. 28, 2016 (IT) .................. 102016000043366

(51) Int. Cl.
| | | |
|---|---|---|
| H04R 25/00 | (2006.01) | |
| H04R 19/04 | (2006.01) | |
| B06B 1/02 | (2006.01) | |
| B81C 1/00 | (2006.01) | |

(Continued)

(52) U.S. Cl.
CPC .......... *H04R 19/04* (2013.01); *B06B 1/0292* (2013.01); *B81B 7/04* (2013.01); *B81C 1/0023* (2013.01);

(Continued)

(58) Field of Classification Search
CPC ...... H04R 1/083; H04R 1/1041; H04R 1/227; H04R 1/2853; H04R 2410/03; H04R 2410/05; H04R 31/006; H04R 5/027; B81B 2201/0257; B81B 7/0061; B81B 2207/07; B81B 7/0064; B81B 2201/0264

(Continued)

(56) References Cited

U.S. PATENT DOCUMENTS

| | | | | |
|---|---|---|---|---|
| 5,742,484 A | * | 4/1998 | Gillette ................ | H05K 1/148 |
| | | | | 174/106 R |
| 2005/0017313 A1 | * | 1/2005 | Wan .................... | B81C 1/00095 |
| | | | | 257/415 |

(Continued)

FOREIGN PATENT DOCUMENTS

| | | |
|---|---|---|
| EP | 2552127 A1 | 1/2013 |
| WO | 2015/106880 A1 | 7/2015 |

*Primary Examiner* — Matthew Eason
*Assistant Examiner* — Julie X Dang
(74) *Attorney, Agent, or Firm* — Seed IP Law Group LLP (57) ABSTRACT

A multi-device module, comprising: a first substrate, which houses a first MEMS transducer, designed to transduce a first environmental quantity into a first electrical signal, and an integrated circuit, coupled to the first MEMS transducer for receiving the first electrical signal; a second substrate, which houses a second MEMS transducer, designed to transduce a second environmental quantity into a second electrical signal; and a flexible printed circuit, mechanically connected to the first and second substrates and electrically coupled to the integrated circuit and to the second MEMS transducer so that the second electrical signal flows, in use, from the second MEMS transducer to the integrated circuit.

21 Claims, 5 Drawing Sheets

(51) Int. Cl.
*H04R 3/00* (2006.01)
*H04R 19/00* (2006.01)
*B81B 7/04* (2006.01)
*H04R 1/44* (2006.01)
*H04R 7/06* (2006.01)
*H04R 31/00* (2006.01)

(52) U.S. Cl.
CPC ............... *H04R 1/44* (2013.01); *H04R 3/005* (2013.01); *H04R 7/06* (2013.01); *H04R 19/005* (2013.01); *H04R 31/003* (2013.01); *H04R 31/006* (2013.01); *B81B 2201/0235* (2013.01); *B81B 2201/0242* (2013.01); *B81B 2201/0257* (2013.01); *B81B 2201/0264* (2013.01); *B81B 2201/0292* (2013.01); *B81B 2201/047* (2013.01); *B81B 2207/012* (2013.01); *B81B 2207/07* (2013.01); *B81C 2203/0792* (2013.01); *H01L 2224/48091* (2013.01); *H01L 2224/48137* (2013.01); *H01L 2924/15151* (2013.01); *H04R 2201/003* (2013.01); *H04R 2499/11* (2013.01)

(58) Field of Classification Search
USPC .......................................................... 381/191
See application file for complete search history.

(56) References Cited

U.S. PATENT DOCUMENTS

| | | | |
|---|---|---|---|
| 2007/0215962 A1* | 9/2007 | Minervini | B81B 7/0064 257/414 |
| 2010/0246877 A1* | 9/2010 | Wang | H04R 19/005 381/361 |
| 2010/0284553 A1* | 11/2010 | Conti | B81B 7/0061 381/174 |
| 2011/0198714 A1* | 8/2011 | Yang | B81B 7/0061 257/416 |
| 2011/0293126 A1* | 12/2011 | Maekawa | H04R 19/005 381/355 |
| 2012/0237073 A1* | 9/2012 | Goida | H04R 1/02 381/361 |
| 2012/0250897 A1 | 10/2012 | Michel et al. | |
| 2013/0070951 A1 | 3/2013 | Tanaka et al. | |
| 2013/0341737 A1* | 12/2013 | Bryzek | H01L 29/84 257/415 |
| 2015/0023523 A1* | 1/2015 | Elian | H04R 1/083 381/91 |
| 2016/0100256 A1* | 4/2016 | Watson | H04R 19/04 381/113 |
| 2016/0345106 A1 | 11/2016 | Pahl et al. | |

\* cited by examiner

MULTI-DEVICE TRANSDUCER MODULE, APPARATUS INCLUDING THE TRANSDUCER MODULE AND METHOD OF MANUFACTURING THE TRANSDUCER MODULE

BACKGROUND

Technical Field

The present disclosure relates to a multi-device transducer module, in particular for transducing environmental quantities, to an apparatus including the multi-device transducer module, and to a method for manufacturing the transducer module.

Description of the Related Art

As is known, an acoustic transducer (in particular, a microphone) of a MEMS (Micro-Electro-Mechanical System) type comprises a membrane sensitive structure, designed to transduce acoustic pressure waves into an electrical quantity (for example, a capacitive variation), and a reading electronics, designed to carry out appropriate processing operations (amongst which amplification and filtering operations) on said electrical quantity for supplying an electrical output signal (for example, a voltage) representing the acoustic pressure wave received.

In the case where a capacitive sensing principle is used, the MEMS sensitive structure in general comprises a mobile electrode, provided as diaphragm or membrane, arranged facing a fixed electrode, to provide the plates of a sensing capacitor with variable capacitance. The mobile electrode is anchored, by a first portion thereof, which is generally perimetral, to a structural layer, whereas a second portion thereof, which is generally central, is free to move or bend in response to the pressure exerted by the incident acoustic pressure waves. The mobile electrode and the fixed electrode thus provide a capacitor, and bending of the membrane that constitutes the mobile electrode causes a variation of capacitance as a function of the acoustic signal to be detected.

A plurality of MEMS microphones are commonly mounted in multimedia electronic devices, such as smartphones. This is due to the fact that microphones are not only used for transducing the voice signal, but also for additional functions such as noise erasure and recording of sound, and each microphone may be dedicated to a specific function. Integration of a considerable number of microphones (e.g., from two to seven microphones) in an electronic device typically involves the use of dedicated integrated circuit boards and thus has a considerable impact on the occupation of space.

Further, according to the known art, each of the MEMS microphones is housed in a package that contains the transducer (e.g., a MEMS transducer) and the electronics for acquisition and pre-processing of the electrical signals generated by the transducer, typically an ASIC (Application-Specific Integrated Circuit). It is evident that this approach is not optimal from the cost standpoint.

The disadvantages of what has been set forth above may extend to MEMS devices other than microphones, for example to pressure sensors or other transducers that are typically present in consumer electronic products.

BRIEF SUMMARY

One or more embodiments are directed to a multi-device transducer module, an apparatus including the multi-device transducer module, and a method for manufacturing the transducer module.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein.

DETAILED DESCRIPTION

Figure 1:
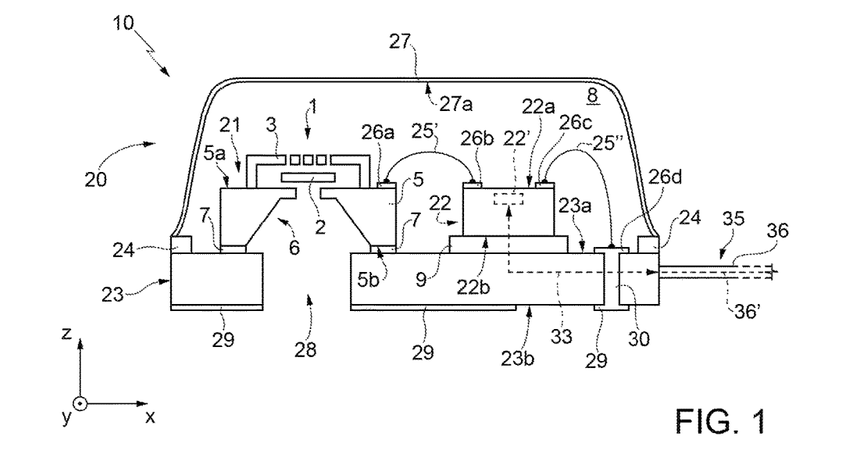
FIG. 1 is a lateral sectional view of a device including a MEMS acoustic transducer and a processing circuit.

With reference to FIG. 1, a MEMS microphone 10 is shown, in a system of spatial co-ordinates x, y, and z. The MEMS microphone 10 comprises a first die (sensor die) 21, which integrates a MEMS structure that provides a first acoustic transducer 1. The first acoustic transducer 1 may be produced according to any technology available and may operate according to any known operating principle. By way of example, the first acoustic transducer 1 is provided with a membrane 2, which is mobile and is made of conductive material, facing a rigid plate 3 (by this term is here meant an element that is relatively rigid with respect to the membrane 2, which is, instead, flexible). The rigid plate 3 includes at least one conductive layer facing the membrane 2, so that the membrane 2 and the rigid plate 3 form facing plates of a capacitor.

The membrane 2, which in use undergoes deformation as a function of incident acoustic pressure waves, is at least partially suspended over a structural layer 5 and directly faces a cavity 6, obtained by digging in an area corresponding to a rear surface 5b of the structural layer 5 (the rear portion 5b is opposite to a front portion 5a of the structural layer 5 itself, arranged in the proximity of the membrane 2).

The first acoustic transducer 1 is housed in an internal cavity 8 of a package 20, together with a second die (control chip) 22 integrating a processing circuit, or ASIC 22'. The ASIC 22', which is in itself known, comprises signal-processing circuits (for example, a charge-amplifier circuit for a capacitive electroacoustic sensor) and/or the components utilized for enabling proper operation of the microphone, in particular as regards transduction of the acoustic signals. The ASIC 22' is electrically coupled to the first acoustic transducer 1 by an electrical conductor 25' (with the wire-bonding technique), which connects together respective pads 26a and 26b of the first and second dice 21, 22.

The first and second dice 21, 22 are coupled side-by-side on a substrate 23 of the package 20. The first die 21 is coupled to the substrate 23 on the rear surface 5b of the structural layer 5, for example by an adhesive layer or a layer of glue 7. Likewise, also the second die 22 is coupled to the substrate 23 on a rear surface 22b thereof, by a solder mask 9 patterned for defining a base for mounting the second die 22. According to an embodiment (not shown), the solder mask 9 may further constitute a supporting base for mounting the first die 21.

The integrated ASIC 22' is provided at a front portion 22a of the second die 22, opposite to the rear surface 22b.

Appropriate metallization layers and/or conductive through vias (an electrical path 30 is illustrated, by way of example, in FIG. 1) are provided in the substrate 23 for routing electrical signals towards the outside of the package 20. Further electrical connections 25", for example obtained with the wire-bonding technique, are provided for coupling one or more pads 26c of the second die 22 to respective pads 26d of the substrate 23.

Electrical connection elements 29, for example in the form of conductive lands, are provided on an underside 23b of the substrate 23 (the side facing outwards), for bonding and electrical connection to a PCB. In one embodiment, the substrate 23 is a substrate of an LGA (Land-Grid Array) type. In this case, the electrical connection elements 29 are provided, in particular, in the form of lands. Alternatively, the lands 29 may be replaced by an array of balls or bumps, thus providing a so-called BGA (Ball-Grid Array) package. The electrical connection elements 29 are electrically coupled to the pads 26d by respective electrical paths 30 through the substrate 23.

The base substrate 23 includes, according to one embodiment, a multilayer structure made up of one or more layers of conductive material (e.g., metal) separated from one another by layers of rigid dielectric material, for example FR4 (including interwoven glass fibers in an epoxy-resin matrix). Conductive through vias extend through the layers of dielectric material for connecting together one or more metal layers, in a way in itself known. The electrical path 30 extends throughout the thickness of the base substrate 23 for connecting an inner surface 23a thereof, facing the internal space 8, to the outer space 23b, facing the external environment, for example for enabling direct access to the ASIC 22' for testing or for transfer of signals in use.

Further coupled to the substrate 23 is a covering element, or cap, 27 of the package 20, which encloses the first and second dice 21, 22. Said cap 27 may be made of pre-molded plastic or metal material.

Also the covering element 27 may be constituted by a multilayer, for example including one or more plastic and/or metal layers, and may advantageously have a metal coating (not shown) on an inner surface 27a thereof, facing the internal space 8, in order to provide an electromagnetic shield. Alternatively, the covering element 27 is completely made of metal.

The covering element 27 is further coupled to the base substrate 23 by coupling regions 24 (solder regions, or regions of glue, or the like) for sealing the internal space 8 hermetically.

According to one aspect of the present disclosure, throughout the thickness of the base substrate 23 a through opening, or hole, 28, is made, designed to arranged in acoustic communication the cavity 6 of the first die 21 with the environment external to the package 20. In what follows, the through opening 28 will also be referred to as a "sound port", and the cavity 6 of the first die 21 will also be referred to as an "acoustic chamber". Further, the term "acoustic communication" is here used with the meaning of "direct acoustic communication", in the sense that generic acoustic waves, or acoustic pressure waves, propagate using as sole propagation medium air (or a possible gas, or mixture of gases, that is equivalent from the standpoint of propagation of sound).

The extension (in the horizontal plane xy) of the acoustic chamber 6 is greater than the corresponding extension (once again in the horizontal plane xy) of the sound port 28, so that the sound port 28 communicates entirely with the acoustic chamber 6 without it having a direct outlet towards the internal space 8 of the package 20.

According to one aspect of the present disclosure, the substrate 23 forms part of a printed circuit of a rigid-flex-rigid type 35, and forms a first rigid portion thereof. Printed circuits of a rigid-flex-rigid type are in themselves known in the art and comprise a flexible portion 36, typically a polyamide film, having electrically conductive lines. The flexible portion 36 is mechanically and electrically coupled, at respective ends thereof, to respective multilayer rigid substrates (one of which, in this case, is the substrate 23 of FIG. 1). Coupling may be made by soldering one end of the flexible portion 36 to, or integrating it in, the substrate 23, during manufacture thereof. The conductive lines of the flexible portion 36 are electrically connected to respective conductive paths of the substrate 23, for example to the metal layers integrated in the substrate 23, or to pads provided on the face 23a or 23b of the substrate 23.

With reference to the flexible portion 36, it should be noted that, in this context, by the term "flexible" is meant a structure that may be bent back on itself without undergoing damage or failure, and without jeopardizing its own electrical or electronic functions. The characteristics of flexibility are further a function of the material used and/or of the thickness, the latter ranging, for example, between 50 μm and 150 μm. It is evident that it is possible to use a flexible portion 36 with a thickness smaller than the one indicated. Instead, a rigid structure, such as the substrate 23, may not be bent back on itself without undergoing damage or failure that would jeopardize the structural stability and/or the electrical or electronic functions thereof. The characteristics of rigidity are further a function of the material used and/or of the thickness, the latter ranging, for example, from 100 μm to 500 μm.

Figure 2:
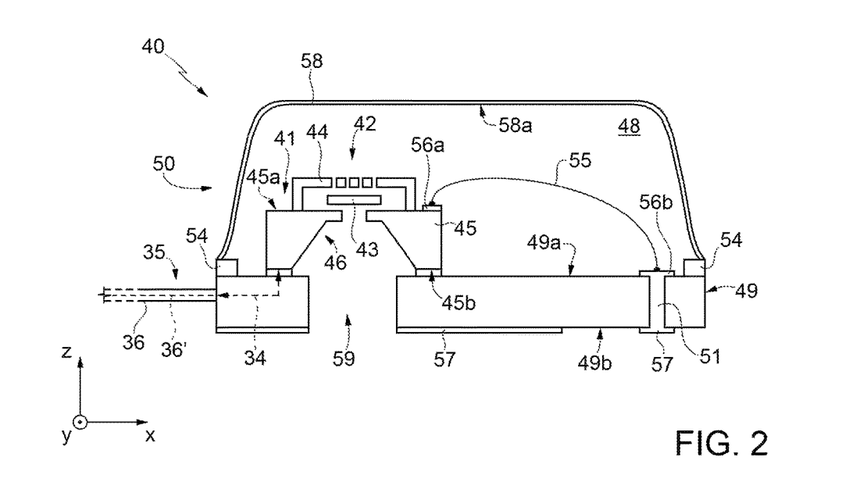
FIG. 2 is a lateral sectional view of a further device including a MEMS acoustic transducer.

A second rigid portion of the rigid-flex-rigid printed circuit 35 according to the present disclosure is formed by a multilayer substrate 49 of a further MEMS microphone 40, illustrated in FIG. 2. The substrate 49 has a structure similar to the one described for the substrate 23, i.e., including metal layers that alternate with dielectric layers (e.g., FR4) and are connected together by conductive through vias. In a way similar to what has been described previously, coupling between the flexible portion 36 and the substrate 49 may be obtained by soldering one end of the flexible portion 36 to, or by integrating it in, the substrate 49, during manufacture thereof. The conductive lines of the flexible portion 36 are electrically connected to respective conductive paths of the substrate 49, for example, to the metal layers integrated in the substrate 49, or to pads provided on opposite faces of the substrate 49.

Figure 3:
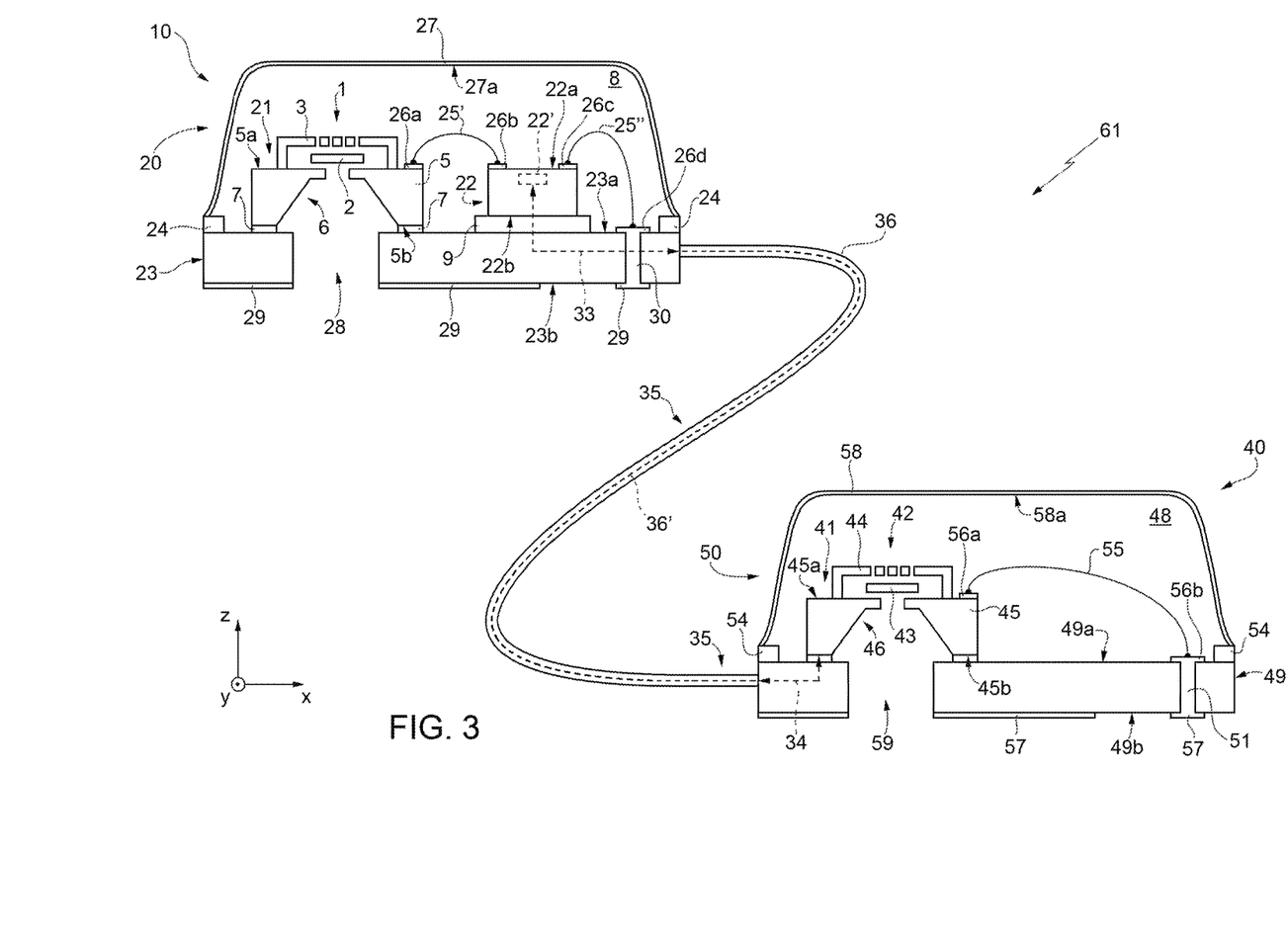
FIG. 3 illustrates a multi-device module including the devices of FIGS. 1 and 2 functionally coupled together by a flexible printed circuit, according to one embodiment of the present disclosure.

Thus, as shown in FIG. 3, the MEMS microphone 10 and the MEMS microphone 40 are mechanically and electrically coupled together by the flexible portion 36, having conductive paths that extend from the substrate 23 to the substrate 49, arranging them in mechanical and electrical connection and thus forming a multi-device module 61.

As shown in FIGS. 2 and 3, the MEMS microphone 40 is similar to the MEMS microphone 10, but does not present the second die (control chip) 22 integrating the processing circuit (ASIC).

The MEMS microphone 40 thus comprises a die 41, which integrates a MEMS structure 42 provided with a membrane 43, which is mobile and is made of conductive material, facing a rigid plate 44 (by this term is here meant an element that is relatively rigid with respect to the membrane 43, which is instead flexible). The rigid plate 44 includes at least one conductive layer facing the membrane 43 so that the membrane 43 and the rigid plate 44 form facing plates of a capacitor.

The membrane 43, which in use undergoes deformation as a function of incident acoustic pressure waves, is at least partially suspended over a structural layer 45 and directly faces a cavity 46, obtained by digging in an area corresponding to a rear surface 45b of the structural layer 45 (the rear portion 45b is opposite to a front portion 45a of the structural layer 45 itself, arranged in the proximity of the membrane 43).

The MEMS structure 42 is housed in an internal cavity 48 of a package 50. The die 41 is coupled to a substrate 49 of the package 50 on the rear surface 45b of the structural layer 45, for example by an adhesive layer (not shown).

Appropriate metallization layers and/or through vias (electrical paths 51 are illustrated by way of example in FIG. 2) are provided in the substrate 49 for routing the electrical signals towards the outside of the package 50. One or more electrical connections 55, obtained with the wire-bonding technique, are provided for coupling one or more pads 56a of the die 41 to respective pads 56b of the substrate 49.

Electrical connection elements 57 are provided on an underside 49b of the substrate 49 (the side facing outwards), for bonding and electrical connection to a printed circuit. In one embodiment, the substrate 49 is of an LGA type, and the electrical connection elements 57 are in the form of lands. Alternatively, the lands 57 may be replaced by an array of balls or bumps to provide a BGA package. The electrical connection elements 57 are electrically coupled to the pads 56b by respective electrical paths 51 through the substrate 49.

Further coupled to the substrate 49 is a covering element or cap 58 of the package 50, which encloses the die 41. Said cap 58 may be made of pre-molded plastic or metal material.

Also the covering element 58 may be constituted by a multilayer, for example including one or more plastic and/or metal layers, and may advantageously have a metal coating (not shown) on an inner surface 58a thereof, facing the internal space 48, in order to provide an electromagnetic shield. Alternatively, the covering element 58 is completely made of metal.

The covering element 58 is further coupled to the base substrate 49 by coupling regions 54 (solder regions, or regions of glue, or the like) for sealing the internal space 48 hermetically.

Throughout the thickness of the base substrate 49 a through opening, or hole, 59 is made, designed to arranged in acoustic communication the cavity 46 of the die 41 with the environment external to the package 50. In what follows, the through opening 59 will be referred to as a "sound port", and the cavity 46 of the die 21 as an "acoustic chamber". Further, the term "acoustic communication" is here used with the meaning of "direct acoustic communication", in the sense that generic acoustic waves, or acoustic pressure waves, propagate using as sole propagation medium air (or a possible gas, or mixture of gases, that is equivalent from the standpoint of acoustic propagation).

The extension (in the horizontal plane xy) of the acoustic chamber 46 is greater than the corresponding extension (once again in the horizontal plane xy) of the sound port 59, so that the sound port 59 communicates entirely with the acoustic chamber 46 without having a direct outlet towards the internal space 48 of the package 50.

On the basis of what has been described above, it should be noted that the MEMS microphone 40 does not include an ASIC for processing the signals transduced by the MEMS device 42. In this case, in fact, the signals transduced by the MEMS device 42 are sent to the second die 22 of the MEMS microphone 10 through conductive paths 33, 34, and 36' (represented schematically with a dashed line in FIG. 3), which extend in part in (or on) the substrate 49, in part in (or on) the flexible portion 36, and in part in (or on) the substrate 23. In other words, the die 41 of the MEMS microphone 40 is electrically coupled to the die 22 of the MEMS microphone 10 via the rigid-flex-rigid printed circuit 35, for mutual transmission of electrical signals. In this way, it is not necessary to provide a dedicated ASIC in the package 50 of the MEMS microphone 40 in so far as the ASIC 22' is shared by both of the MEMS devices 1, 42, with a considerable saving in terms of costs and physical space utilized.

Figure 4:
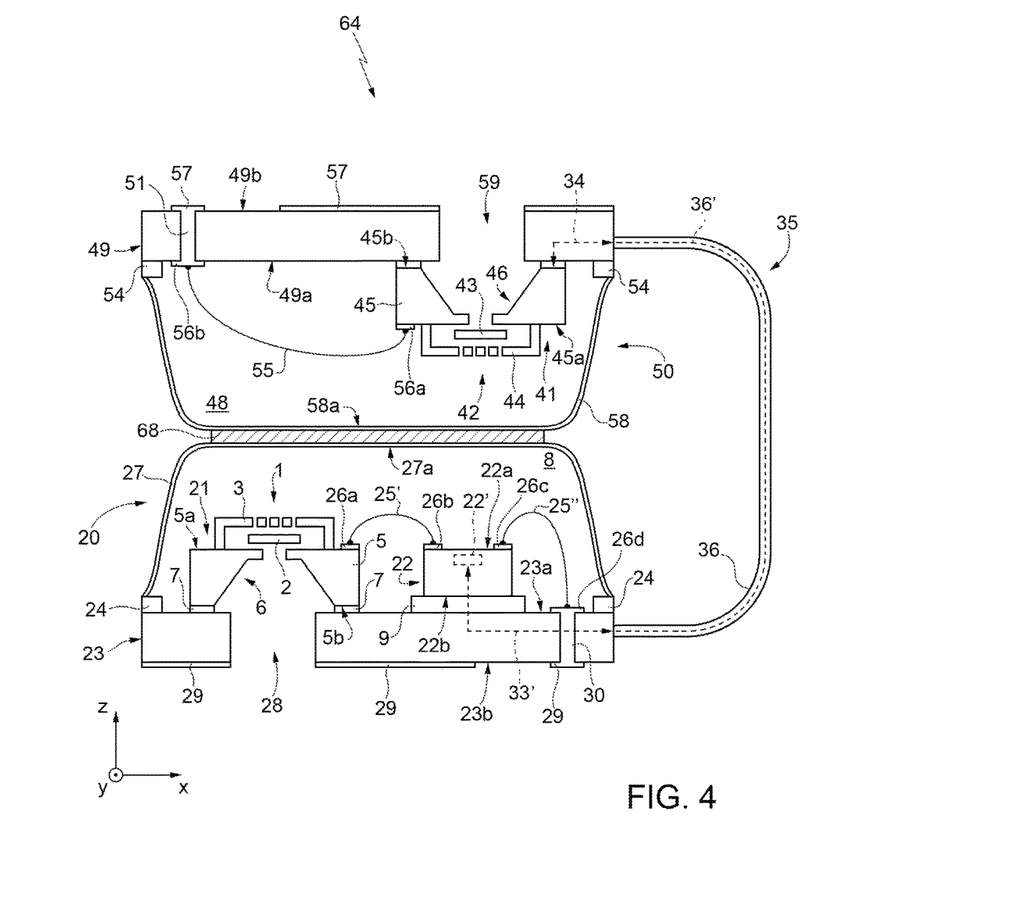
FIG. 4 illustrates a multi-device module including the devices of FIGS. 1 and 2 functionally coupled together by a flexible printed circuit and arranged for forming a stacked structure, according to one embodiment of the present disclosure.

FIG. 4 illustrates the MEMS microphone 10 and the MEMS microphone 40 coupled together at the respective covering elements 27, 58, according to one embodiment of the present disclosure.

In particular, a coupling layer 68, made, for example, of an adhesive material, such as conductive glue, non-conductive glue, a bi-adhesive layer, such as double sided tape, or any other suitable material, extends between the covering element 27 and the covering element 58, the latter elements being coupled together by the coupling layer 68. A stack 64 is thus formed, which is constituted by the MEMS microphones 10 and 40, connected together by the rigid-flex-rigid printed circuit 35, as described previously. The presence of the flexible portion 36, which may be completely bent back on itself, renders possible the arrangement in space of FIG. 4.

This embodiment enables formation of a structure of transducers having the respective sound ports 28, 59 arranged opposite to one another. In this way, one sound port (e.g., the sound port 28) may be used for acquisition of an acoustic signal (e.g., a voice signal), whereas the other sound port (here, the sound port 59) may be used for acquisition of the environmental noise. Both of the signals transduced by the respective MEMS devices 1, 42 are sent to the ASIC 22', which processes them and, in this example, carries out erasure of the background noise present in the signal acquired via the sound port 28.

Figure 5:
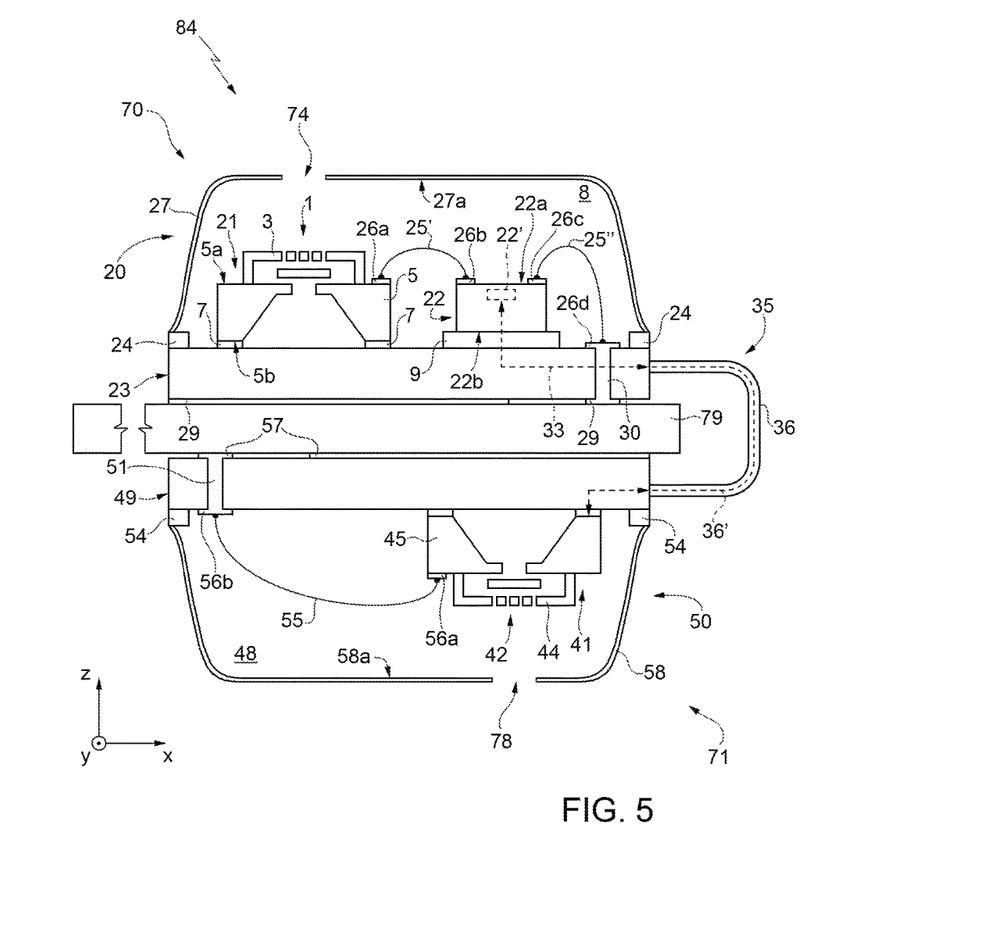
FIG. 5 illustrates a multi-device module including transducer devices according to a variant of FIGS. 1 and 2, functionally coupled together by a flexible printed circuit and arranged on opposite sides of a PCB (Printed-Circuit Board) to form a stacked structure according to a further embodiment of the present disclosure.

FIG. 5 illustrates a multi-device module 84 including a MEMS microphone 70 and a MEMS microphone 71 coupled together at respective substrates 27, 49 with the mediation of a PCB 79, according to one embodiment of the present disclosure.

The MEMS microphone 70 is similar to the MEMS microphone 10 of FIGS. 1-4 (elements that are in common are designated by the same reference numbers and are not described any further), but differs therefrom in that the sound port 28 obtained through the substrate 23 is absent. Instead, the MEMS microphone 70 has a through hole 74 made through the covering element 27 to form a sound port of the MEMS microphone 70.

The MEMS microphone 71 is similar to the MEMS microphone 40 of FIGS. 2-4 (elements that are in common are designated by the same reference numbers and are not described any further), but differs therefrom in that the sound port 59 made through the substrate 49 is absent. Instead, the MEMS microphone 71 has a through hole 78 made through the covering element 58 to form a sound port of the MEMS microphone 71.

Providing the sound ports 74, 78 through the covering elements 27, 58 enables mounting of the MEMS microphones 70, 71 on the PCB 79 through the respective substrates 23, 49. In this way, a stack 80 is formed, constituted by the MEMS microphone 70, by the PCB 79, and by the MEMS microphone 71, rendered possible by the presence of the flexible portion 36 of the rigid-flex-rigid printed circuit 35, which may be completely bent back on itself, which renders possible the arrangement in space of FIG. 4. The PCB 79 is designed to be installed, for example, in a portable voice communication device, such as a smartphone.

Unlike what is shown in FIG. 5, it is also possible to couple the MEMS microphones 70, 71 to PCBs different from one another, according to the need.

It is further evident that the MEMS microphone 10 (having the sound port 28 obtained through the substrate and including the control chip 22) and the MEMS microphone 71 (having the sound port 78 obtained through the covering element 58) may be coupled together by the flexible portion 36 of the rigid-flex-rigid printed circuit 35, i.e., by providing the MEMS microphones 10, 71 in respective rigid portions of the rigid-flex-rigid printed circuit 35, in a way similar to what has been described previously.

Likewise, the MEMS microphone 40 (having the sound port 28 obtained through the substrate and without the control chip 22) and the MEMS microphone 70 (having the sound port 78 obtained through the covering element 58 and including the control chip 22) may be coupled together by the flexible portion 36 of the rigid-flex-rigid printed circuit 35, i.e., by providing the MEMS microphones 40, 70 in respective rigid portions of the rigid-flex-rigid printed circuit 35, in a way similar to what has been described previously.

According to further variants of the present disclosure, one of the MEMS microphones 10 and 40 of FIGS. 3 and 4 may be replaced by a transducer of a different type, for example chosen in the group comprising: a pressure sensor (transducer), a UV sensor, an IR sensor, a generic light-signal sensor (e.g., a photodiode), an accelerometer, or a gyroscope.

In this case, only one between the MEMS microphone 10 (or 40) and the transducer of a different type includes the control chip 22, in so far as transmission to the ASIC 22' of the signals transduced by the other between the MEMS microphone 10 (or 40) and the transducer of a different type occurs via the rigid-flex-rigid printed circuit 35.

Likewise, according to further variants of the present disclosure, also one of the MEMS microphones 70 and 71 of FIG. 5 may be replaced by a transducer of a different type, for example chosen in the group comprising: a pressure sensor (transducer), a UV sensor, an IR sensor, a generic light-signal sensor (e.g., a photodiode), an accelerometer, or a gyroscope.

In this case, only one between the MEMS microphone 70 (or 71) and the transducer of a different type includes the control chip 22, in so far as transmission to the ASIC 22' of the signals transduced by the other between the MEMS microphone 70 (or 71) and the transducer of a different type occurs via the rigid-flex-rigid printed circuit 35.

Figure 6:
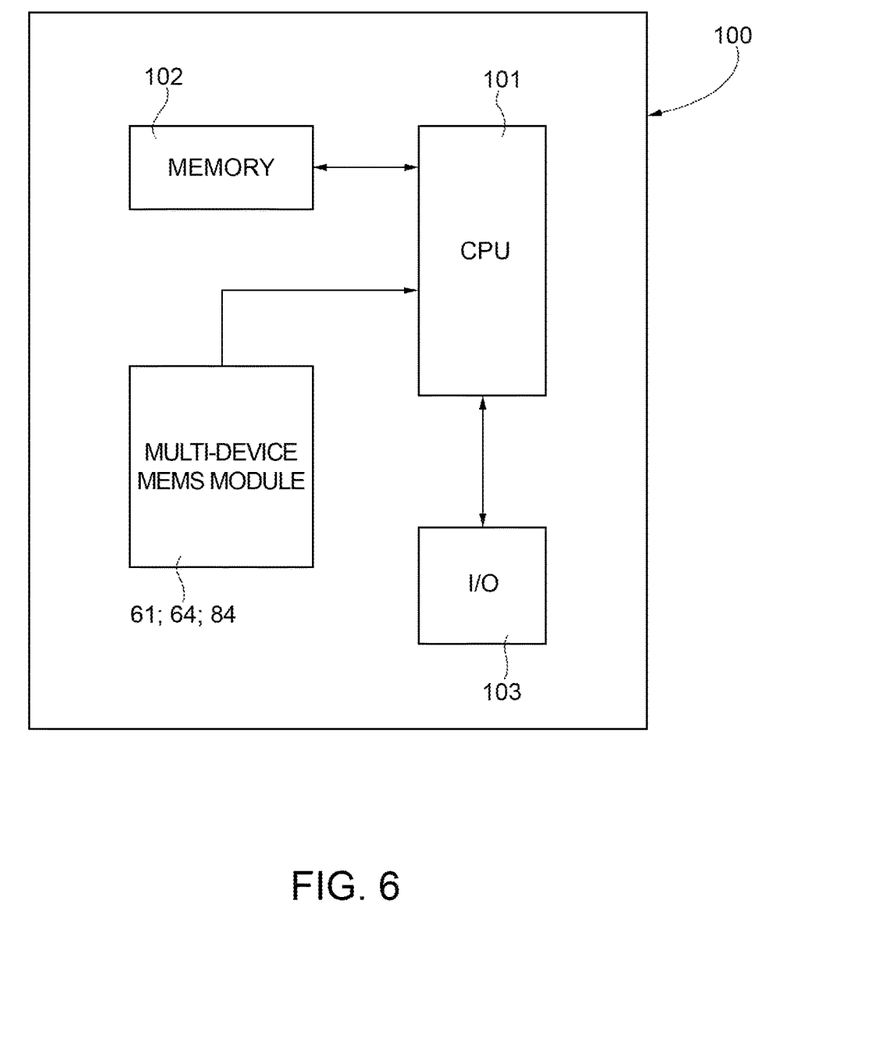
FIG. 6 is a schematic illustration of an electronic apparatus including a multi-device module according to any one of the embodiments of the present disclosure.

FIG. 6 shows an electronic device 100 that uses the multi-device module 61 of FIG. 3, and/or one or both of the stacked configurations shown in FIGS. 4 and 5.

The electronic device 100 comprises, in addition to the multi-device module 61, a microprocessor (CPU) 101, a memory block 102, connected to the microprocessor 101, and an input/output interface 103, for example a keypad and/or a display, which is also connected to the microprocessor 101.

The multi-device module 61 communicates with the microprocessor 101, and in particular transmits the electrical signals processed by the ASIC 22' of the die 22 associated to the MEMS detection structures of the die 21 and of the die 41.

The electronic device 100 is, for example, a mobile communication device, such as a cellphone, a PDA, a notebook, but also a voice recorder, a reader of audio files with voice-recording capacity, a console for video-games, a wearable device, such as a smartwatch, a hydrophone, etc.

The advantages of the disclosure described previously, according to the various embodiments, emerge clearly from the foregoing description.

In particular, the present disclosure provides a multi-device module that may be adapted to different configurations according to the need, at the same time reducing the costs and requirements of space in so far as some components (e.g., the ASIC 22') are shared.

Finally, it is clear that modifications and variations may be made to what has been described and illustrated herein, without thereby departing from the scope of the present disclosure.

In particular, a different configuration of the MEMS acoustic transducer may be envisaged, specifically as regards the geometrical shape of the constituent elements. In the case where the space inside the package so allows, even a number of MEMS sensors or transducers may possibly be housed within a same package, each configured to detect a respective environmental quantity. Further integrated circuits (e.g., ASICs) may further be provided and housed within the same package, the functions of which are shared between different packages connected together by a flexible printed circuit.

Further, it is possible to form multi-device modules including any number of packages, connected together by respective flexible PCBs, thus forming a "chain" of devices. In this chain of devices only one of them is provided with a signal-processing integrated circuit (e.g., the ASIC 22'), whereas the remaining devices of the chain communicate with the signal-processing integrated circuit via the conductive lines of the flexible printed circuits and dedicated paths provided within the substrates.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A multi-device module, comprising:
a first substrate supporting:
    a first MEMS transducer configured to detect a first environmental quantity and to generate a first transduced signal as a function of the first environmental quantity detected, and
    an integrated circuit operatively coupled to the first MEMS transducer for receiving the first transduced signal;
a second substrate supporting a second MEMS transducer configured to detect a second environmental quantity and generate a second transduced signal as a function of the second environmental quantity detected; and
a flexible printed circuit having a first end and a second end, the first end being mechanically coupled to the first substrate, the second end being mechanically coupled to the second substrate, the flexible printed circuit being electrically coupled to the integrated circuit and to the second MEMS transducer so that the second transduced signal flows, in use, from the second MEMS transducer to the integrated circuit.

2. The multi-device module according to claim 1, wherein the first substrate, the flexible printed circuit, and the second substrate form a printed circuit of a rigid-flex-rigid type.

3. The multi-device module according to claim 1, wherein:
    the first and second substrates includes respective metal and dielectric alternating layers, and respective conductive through vias that extend between one or more respective dielectric layers for electrically connecting together two or more metal layers, and
    the flexible printed circuit extends within the first and second substrates and is electrically coupled to the integrated circuit and to the second MEMS transducer by one or more of the metal layers and conductive through vias for providing an electrical connection between the second MEMS transducer and the integrated circuit.

4. The multi-device module according to claim 3, wherein the dielectric layers are made of a material including interwoven glass fibers in an epoxy-resin matrix, or FR4.

5. The multi-device module according to claim 1, wherein the integrated circuit is an ASIC.

6. The multi-device module according to claim 1, wherein the first MEMS transducer and the second MEMS transducer are chosen in the group comprising: a pressure sensor (transducer), a light-flow sensor, a UV sensor, an IR sensor, an accelerometer, and a gyroscope.

7. The multi-device module according to claim 1, further comprising:
    a first covering element coupled to the first substrate and defining, along with the first substrate, a first package that houses the first MEMS transducer and the integrated circuit; and
    a second covering element coupled to the second substrate and defining, along with the second substrate, a second package that houses the second MEMS transducer,
    wherein the first and second MEMS transducers are acoustic transducers, the first substrate having a first acoustic-access opening in acoustic communication with an environment external to the first package, and the second substrate having a respective second acoustic-access opening in acoustic communication with an environment external to the second package, and
    the first and second packages being mechanically coupled together at the first and second covering elements.

8. The multi-device module according to claim 1, further comprising:
    a first covering element that extends over the first substrate and defines, with the first substrate, a first package that houses the first MEMS transducer and the integrated circuit; and
    a second covering element that extends over the second substrate and defines, with the second substrate, a second package that houses the second MEMS transducer;
    wherein the first and second MEMS transducers are acoustic transducers, the first covering element having a first acoustic-access opening in acoustic communication with an environment external to the first package, and the second covering element having a respective second acoustic-access opening in acoustic communication with an environment external to the second package, and
    the first and second packages being mechanically and electrically coupled to respective faces of an integrated-circuit board via the respective first and second substrates for forming a stacked structure.

9. An electronic apparatus, comprising:
a microprocessor; and
a multi-device module according to claim 1 coupled to the microprocessor, the electronic apparatus being chosen in the group comprising: a cellphone, a PDA, a notebook, a voice recorder, an audio reader with functions of voice recorder, a console for video-games, a hydrophone.

10. The electronic apparatus according to claim 9, wherein the electronic apparatus is at least one of a cellphone, a PDA, a notebook, a voice recorder, an audio reader with functions of voice recorder, a console for video-games, a hydrophone, and a wearable device.

11. The electronic apparatus according to claim 9, comprising:
    a first covering element coupled to the first substrate and defining, along with the first substrate, a first package that houses the first MEMS transducer and the integrated circuit, the first package including a through hole that places the first MEMS transducer in acoustic communication with an environment external to the first package; and
    a second covering element coupled to the second substrate and defining, along with the second substrate, a second package that houses the second MEMS transducer, the second package including a through hole that places the second MEMS transducer in acoustic communication with an environment external to the second package.

12. A method for manufacturing a multi-device module, comprising the steps of:
    forming a first package that includes a first MEMS transducer and an integrated circuit, the first MEMS transducer configured to detect a first environmental quantity and to generate a first transduced signal as a function of the first environmental quantity detected, the integrated circuit operatively coupled to the first MEMS transducer and configured to receive the first transduced signal; and
    forming a second package that includes a second MEMS transducer, the second MEMS transducer configured to detect a second environmental quantity and to generate a second transduced signal as a function of the second environmental quantity detected; and mechanically and electrically coupling a first end and a second end of a flexible printed circuit to the first and second packages, respectively, wherein the second MEMS transducer is coupled to the integrated circuit by the flexible printed circuit, the integrated circuit configured to receive the second transduced signal from the second MEMS transducer.

13. The method according to claim 12, comprising coupling the first package and the second package together.

14. The method according to claim 12, wherein mechanically and electrically coupling the first end and the second end of the flexible printed circuit comprises coupling the first end of the flexible printed circuit to a first substrate of the first package and coupling the second end of the flexible printed circuit to a second substrate of the second package.

15. A multi-device module, comprising:
a first package including:
a first MEMS transducer configured to detect a first environmental quantity and to generate a first transduced signal as a function of the first environmental quantity detected, and
an integrated circuit operatively coupled to the first MEMS transducer and configured to receive the first transduced signal;
a second package including a second MEMS transducer configured to detect a second environmental quantity and generate a second transduced signal as a function of the second environmental quantity detected; and
a flexible printed circuit having a first end mechanically coupled to the first package and a second end mechanically coupled to the second packages, the flexible printed circuit being electrically coupled to the integrated circuit and to the second MEMS transducer, wherein the second MEMS transducer is configured to provide the second transduced signal to the integrated circuit through the flexible printed circuit.

16. The multi-device module according to claim 15, comprising a printed circuit board having a first surface and a second surface that is opposite the first surface, the first package coupled to the first surface of the printed circuit board, the second package coupled to the second surface of the printed circuit board.

17. The multi-device module according to claim 15, comprising an adhesive material, the adhesive material coupling the first package and the second package together.

18. The multi-device module according to claim 17, wherein the adhesive material couples a first cover of the first package to a second cover of the second package.

19. The multi-device module according to claim 15, wherein the flexible printed circuit is in a U-shape.

20. The multi-device module according to claim 15, wherein the first package includes a first substrate having a first through hole, wherein the second package includes a second substrate having a second through hole.

21. The multi-device module of claim 1, wherein the first MEMS transducer and the second MEMS transducer are vertically stacked.

* * * * *

UNITED STATES PATENT AND TRADEMARK OFFICE
CERTIFICATE OF CORRECTION

PATENT NO. : 10,091,587 B2
APPLICATION NO. : 15/377627
DATED : October 2, 2018
INVENTOR(S) : Roberto Brioschi et al.

Page 1 of 1

It is certified that error appears in the above-identified patent and that said Letters Patent is hereby corrected as shown below:

In the Claims

Column 12, Line 3 Claim 15:
"second packages," should read, --second package,--.

Signed and Sealed this
Twenty-first Day of May, 2019

Andrei Iancu
*Director of the United States Patent and Trademark Office*